United States Patent [19]

Russell et al.

[11] 3,801,923

[45] Apr. 2, 1974

[54] TRANSCONDUCTANCE REDUCTION USING MULTIPLE COLLECTOR PNP TRANSISTORS IN AN OPERATIONAL AMPLIFIER

[75] Inventors: Ronald W. Russell, Mesa, Ariz.; James E. Solomon, Saratoga, Calif.

[73] Assignee: Motorola, Inc., Franklin Park, Ill.

[22] Filed: July 11, 1972

[21] Appl. No.: 270,765

[52] U.S. Cl. .............................. 330/30 D, 330/38 M

[51] Int. Cl. ............................................. H03f 3/08

[58] Field of Search .................. 330/20, 30 D, 38 M

[56] References Cited

UNITED STATES PATENTS

| | | | |
|---|---|---|---|
| 3,673,508 | 6/1972 | Callahan | 330/30 D |
| 3,538,449 | 11/1970 | Solomon | 330/30 D |
| 3,699,464 | 10/1972 | Zodel | 330/30 D X |
| 3,670,253 | 6/1972 | Newcomb et al. | 330/30 D X |

OTHER PUBLICATIONS

Stafford et al., "A Monolithic Radiation-Hardened Operational Amplifier," Solid-State Technology, May 1970 pp. 67–72.

*Primary Examiner*—Herman Karl Saalbach
*Assistant Examiner*—James B. Mullins
*Attorney, Agent, or Firm*—Vincent J. Rauner; Charles R. Hoffman

[57] ABSTRACT

A differential input stage for an integrated circuit operational amplifier, having low transconductance, yet having high frequency response. The low transconductance of the differential input stage is achieved without sacrificing frequency response by using multiple collector lateral PNP transistors, whereby only a fraction of the total PNP transistor current flows in the collector circuit and contributes to the transconductance of the differential amplifier stage.

3 Claims, 5 Drawing Figures

TRANSCONDUCTANCE REDUCTION USING MULTIPLE COLLECTOR PNP TRANSISTORS IN AN OPERATIONAL AMPLIFIER

BACKGROUND OF THE INVENTION

This invention relates to low cost integrated circuit operational amplifiers. Prior art operational amplifiers have required large compensation capacitors to accomplish the amount of compensation necessary to achieve stable operation in a non-inverting unity gain configuration. This in turn has necessitated that additional terminals be provided for connecting the external capacitors, and has reduced the number of operational amplifiers that could be fabricated on a single semiconductor chip. However, for operational amplifiers which are designed for very low cost applications, such as automotive electronic systems, it is essential that as many operational amplifiers as possible be fabricated on a single semiconductor chip and encased in an economical package having a minimum number of leads. For such systems, it is further necessary that the operational amplifiers operate efficiently from a single power source, for example an automobile battery. The common mode input voltage range should also include the system ground voltage. The present invention solves the difficulties of the prior art by providing an operational amplifier which features internal compensation by means of a small capacitor on the monolithic chip. The compensation is achieved without sacrificing the frequency response of the operational amplifier.

SUMMARY OF THE INVENTION

An object of this invention is to provide a low cost operational amplifier, suitable for applications in automotive electronic systems, having internal compensation and operable from a single power source.

A further object of this invention is to provide an operational amplifier of the type described in which the transconductance of the input stage is very low, so that the internal compensation capacitor may be very small.

A further object of this invention is to provide an operational amplifier of the type described in which lateral split-collector PNP transistors are used to reduce the transconductance of the differential input stage without sacrificing frequency response.

A feature of this invention is provision of an integrated circuit operational amplifier operable from a single supply and having internal compensation and having an input circuit stage which includes the system ground voltage in the input common mode voltage range.

Another feature of this invention is provision of an input stage having reduced transconductance so that the internal compensation capacitor is reduced in size, so that chip area occupied by the operational amplifier is reduced.

Another feature of this invention is provision of lateral multiple-collector PNP transistors in the input stage to reduce transconductance of the input stage without sacrificing frequency response or chip area.

Briefly described, the present invention is embodied in a monolithic integrated circuit operational amplifier including a transimpedance stage having Miller feedback capacitance compensation, driven by a transconductance stage including a differential input circuit and a differential to single-ended converter circuit. The feedback capacitance required to achieve stability of the operational amplifier is proportional to the transconductance $g_m$ of the entire transconductance stage. In this invention the transconductance $g_m$ is reduced by using emitter coupled lateral multiple-collector PNP transistors in the differential input circuit. Only a portion of the emitter current through the multiple-collector PNP transistors flows through their respective collectors connected to the differential to single-ended converter circuit, and the remaining current (except for base current) flows through the other collector of each PNP transistor not connected to the differential to single-ended converter circuit. Thus, a portion of the current through each lateral multiple-collector PNP device by-passes the differential to single-ended converter circuit, thereby reducing the transconductance $g_m$ of the entire transconductance stage in proportion to the relative areas of the collectors of the lateral PNP transistors. This permits the use of a small compensating capacitor, which requires a minimum amount of chip area.

BREIF DESCRIPTION OF THE DRAWING

DETAILED DESCRIPTION OF THE INVENTION

Identification of Circuit Stages

In the following description of the invention components in each stage and section of the operational amplifier will be specifically identified to ensure a good understanding of the stage itself. Other components in the various stages of the amplifier will be specifically referred to only in the description of the operation of the amplifier.

Figure 1:
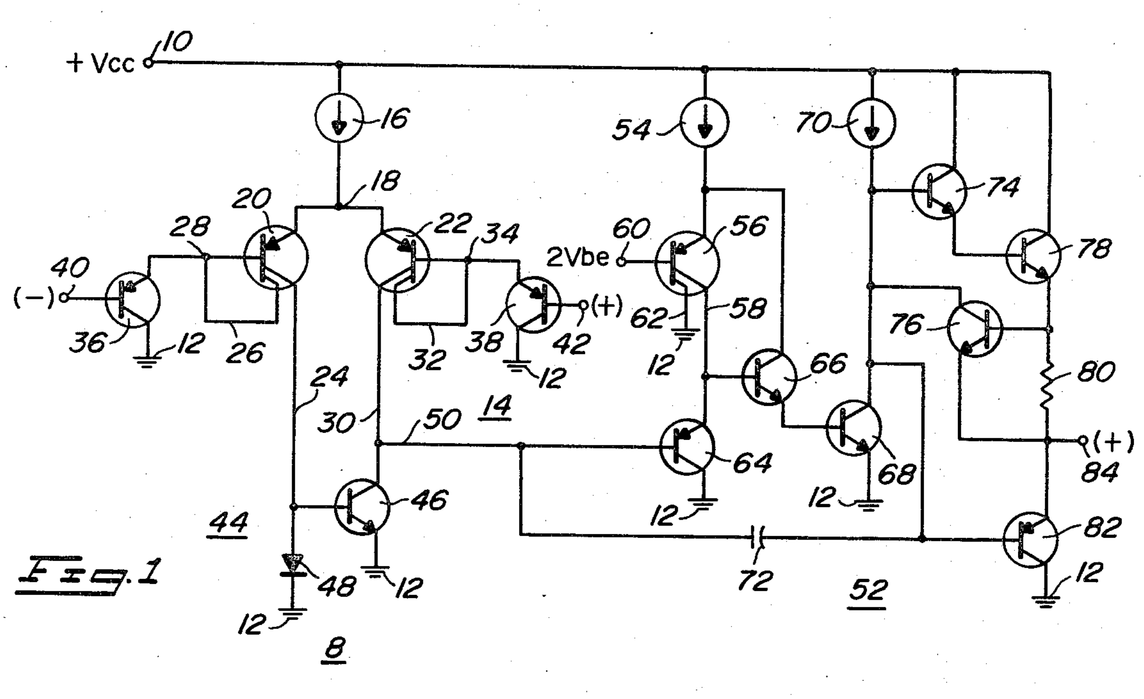
FIG. 1 is a schematic diagram of the preferred embodiment of this invention, an internally compensated operational amplifier having a low transconductance input stage.
Figure 2:
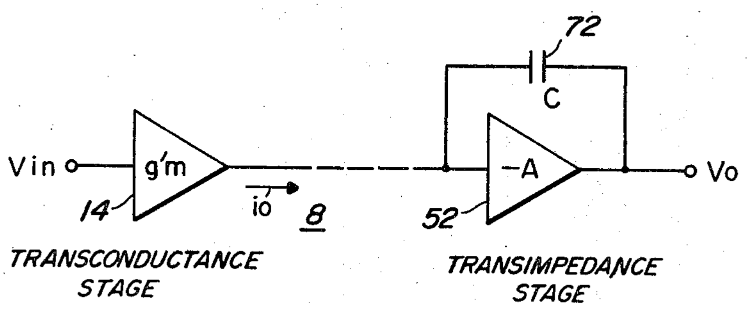
FIG. 2 is a block diagram representing an internally compensated operational amplifier as a transimpedance stage driven by a transconductance input stage.

FIG. 2 is a block diagram of a two stage split-pole configuration of an operational amplifier, consisting of an input transconductance stage 14 having transconductance $g_m$ driving an inverting transimpedance stage 52 having a voltage gain of magnitude A. A feedback capacitor 72 provides feedback from the output portion of transimpedance stage 52 to the input portion, thereby providing internal compensation for the operational amplifier 8. A more detailed diagram of the preferred embodiment of this invention is shown in FIG. 1, wherein the operational amplifier 8 in FIG. 1 includes transconductance stage 14 and transimpedance stage 52. Transconductance stage 14 includes a differential input circuit 19 including constant current source 16, lateral multiple-collector PNP transistors 20 and 22 in an emitter coupled configuration, and substrate PNP input transistors 36 and 38, whose base electrodes are connected to input 40 and input 42, respectively. Transconductance stage 14 also includes a differential to single-ended converter circuit 44, which includes diode 48 and NPN transistor 46. Transimpedance stage 52 includes input buffer circuit 61 including complementary emitter follower transistors 64 and 66 and constant current source 54. Node 50, the output of transconductance stage 14 is connected to the base electrode of transistor 64. The output section of transimpedance stage 52 includes transistor 68, constant current source 70, cascaded emitter follower transistors 74 and 78, and a current limiting circuit including resistor 80 and transistor 76, and substrate PNP pull-down transistor 82. A compensation capacitor 72 is connected between the collector of transistor 68 and node 50, the input terminal to transimpedance stage 52.

OPERATION

Figure 3A:
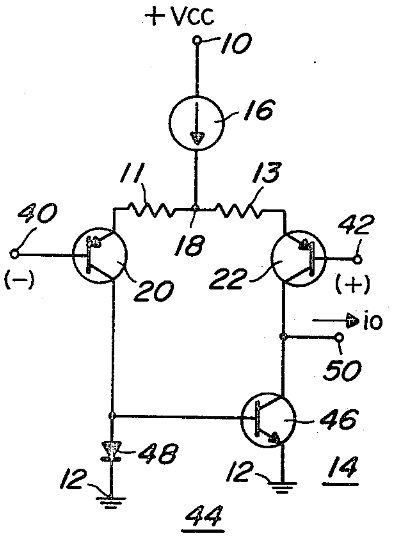
FIGS. 3A and 3B illustrate, respectively, prior art methods of reducing the transconductance of the input stage of an operational amplifier.
Figure 3B:
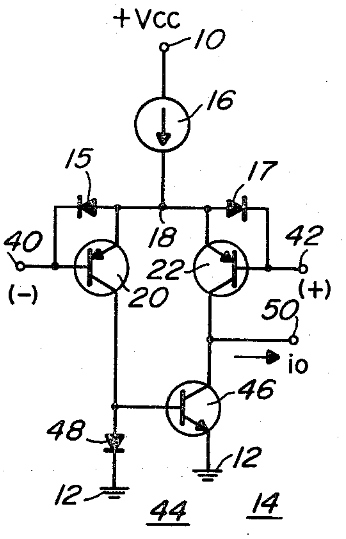
Figure 3C:
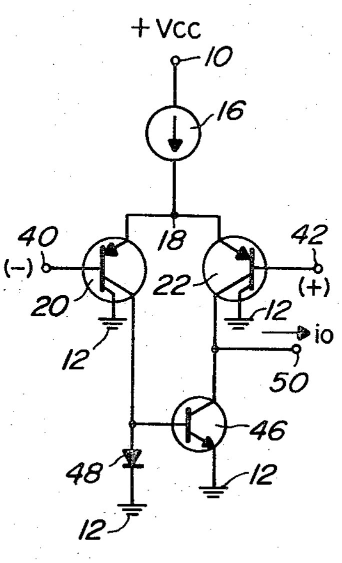
FIG. 3C illustrates the method of this invention for reducing the transconductance of an input stage of an operational amplifier.

It is known that the overall voltage gain of operational amplifier 8 shown in FIG. 2, at high frequencies, is the product of the transconductance $g_m$ of input stage 14 and the transimpedance ($1/sC$) of stage 52 where WC is the value of compensation capacitor 72. Therefore, the unity gain radian frequency, C, is equal to ($g_m/C$). Thus, it is seen that in order to reduce the size of compensation capacitor 72, and still have the amplifier stable in a non-inverting unity gain configuration, the transconductance $g_m$ of stage 14 must also be reduced. Several known techniques for reducing the transconductance of an emitter coupled differential amplifier transconductance stage 14 are illustrated in FIGS. 3A and 3B. In FIG. 3A, the addition of emitter degeneration resistors 11 and 13 have a value $R_E$ is shown. The value of $R_E$ can be made large enough to permit biasing the transistors (for improved frequency response) and also to obtain a small value transconductance $g_m$. Unfortunately, the amount resistance $R_E$ required to obtain sufficiently low $g_m$ is in excess of 100 kilohms. Diffused resistors of this magnitude consume a large amount of chip area, especially if they are to be closely matched to prevent large input offset voltages from occurring. To use these large-valued area-consuming resistors would defeat the purpose of compensating the amplifier with a small value capacitance. Another technique for reducing the transconductance is shown in FIG. 3B. Diodes 15 and 17 are added in shunt with the base emitter junction of PNP transistors 20 and 22, so that a portion of the current supplied by constant current source 16 by-passes the emitter base junctions, thereby reducing the transconductance $g_m$ of stage 14. This technique has the disadvantage that diodes 15 and 17 occupy a considerable amount of chip area. Also, the transconductance $g_m$ of stage 14 can be reduced by simply reducing the current supplied by constant current source 16. Here the disadvantage is that the small biasing currents through PNP transistors 20 and 22 cause a degradation of their frequency response, and consequently the frequency response of transconductance stage 14 is reduced. The final result is that a much larger compensation capacitor 72 (FIG. 2) is required. FIG. 3C illustrates the method of reducing the transconductance $g_m$ of stage 14 according to the present invention. Lateral multiple-collector PNP transistors 20 and 22 are used in the differential input circuit. The collectors of transistor 20 (and also the collectors of transistor 22) have area A and $n$A, respectively, and collect emitted current in this proportion. The transconductance $g_m$ of stage 14 in FIG. 3C is thus reduced by a factor of ($n$+1). Since the current delivered by constant current source 16 is not reduced according to this method, the quiescent current in the emitters of transistors 20 and 22 is not reduced, and therefore the frequency response of the transconductance stage 14 is not sacrificed. Referring back to FIG. 1, it is seen that the transconductance stage 14 from FIG. 3C is modified by the addition of substrate PNP input transistors 36 and 38. This provides a dc input level shift which allows the ground voltage to be included in the common mode input voltage range, and further reduces the input currents from input terminals 4 and 42. Collectors 26 and 32 of lateral PNP transistors 20 and 22, respectively, each having area $n$A, are connected to the emitters of transistors 36 and 38, providing bias current for them rather than being connected to ground as shown in FIG. 3C. The differential to single-ended converter 44 is connected to the two remaining collectors 24 and 30 of lateral PNP transistors 20 and 22, respectively, and eliminates the need for a common mode loop to set the currents in the input stage. The output of this stage, node 50, is buffered from a low input impedance by emitter follower input devices 64 and 66. These transistors are of opposite polarity, so that the level shifts through them are essentially cancelled. The drive to the emitter follower buffer stage is limited approximately to the value I2 of current source 54. In normal operation output 84 will be returned to ground voltage through an external load resistor (not shown). When used in this manner the output stage is biased class A. Emitter follower transistors 74 and 78 provide increased output current capability and load isolation. Since the output of transistor 68 is sufficient to easily keep transistors 74 and 78 turned off, the external load resistor can pull the output terminal 84 to ground. Under these conditions, both the input and output voltage range can include ground. Short circuit current limiting is provided by robbing base drive from transistor 74 through transistor 76 when the current through resistor 80 forward biases the emitter junction of transistor 76. In addition, the substrate PNP transistor 82 provides increased output pull-down under large signal conditions.

While the invention has been shown in connection with certain specific examples, it will be readily apparent to those skilled in the art that various changes in form and arrangement of parts may be made to suit the requirements without departing from the spirit and scope of this invention.

What is claimed is:

1. An integrated circuit operational amplifier comprising:

a transconductance stage including a differential input stage and a differential to single-ended converter stage, said differential input stage including a first constant current source and also including first, second, third and fourth transistors, said first and second transistors having, respectively, an emitter electrode, a base electrode, and first and second collector electrodes, said third and fourth transistors having, respectively, an emitter electrode, a base electrode, and collector electrode, said first and second transistors being split collector lateral PNP transistors, said third and fourth transistors being substrate PNP transistors, said constant current source being coupled to a first power supply conductor, and also being connected to both of said emitters of said first and second transistors, said third transistor having its base electrode coupled to a first input terminal its collector electrode coupled to a second power supply conductor, and its emitter electrode coupled to said first collector electrode and said first base electrode of said first transistor, said fourth transistor having its base electrode coupled to a second input terminal, its collector electrode coupled to said second power supply conductor, and its emitter electrode coupled to said first collector electrode and said base electrode of said second transistor, said differential to single-ended converter including a fifth transistor and a diode, said fifth transistor being an NPN transistor having an emitter electrode, a base electrode, and a collector electrode, said collector electrode of said fifth transistor being coupled to said second collector electrode of said second transistor, said emitter electrode of said fifth transistor being coupled to said second power supply conductor, said base electrode of said fifth transistor being coupled to an anode of said diode and also to said second collector electrode of said first transistor, a cathode of said diode being coupled to said second power supply conductor; and a transimpedance stage coupled between said collector of said fifth transistor and an output terminal, whereby the transconductance of said transconductance stage is reduced, permitting reduction in value of a feedback compensation capacitor in said transimpedance stage.

2. The integrated circuit operational amplifier as recited in claim 1 wherein said feedback compensation capacitor is coupled between said collector of said fifth transistor and an output stage of said transimpedance stage.

3. The integrated circuit operational amplifier as recited in claim 1 wherein said transimpedance stage comprises:

second and third constant current soruces; and sixth, seventh, eighth, ninth, tenth, eleventh, twelfth and thirteenth transistors each having, respectively, an emitter electrode, a base electrode, and a collector electrode, said sixth, seventh, and thirteenth transistors being PNP transistors and said eighth, ninth, tenth, eleventh, and twelfth transistors being NPN transistors, said base electrode of said sixth transistor being coupled to said collector electrode of said fifth transistor, said sixth transistor having its collector electrode connected to said second power supply conductor and its emitter electrode connected to said collector electrode of said seventh transistor and also to said base electrode of said eighth transistor, said seventh transistor having its emitter coupled to said second constant current source and said collector of said eighth transistor and its base connected to a voltage reference node, said second constant current source also being coupled to said first power supply conductor, said emitter of said eighth transistor being coupled to said base electrode of said ninth transistor, said ninth transistor having its emitter electrode coupled to said second power supply conductor and its collector electrode coupled to said base electrode of said thirteenth transistor and also to said collector electrode of said tenth transistor and also to said base electrode of said eleventh transistor and also to said third constant current source, said third constant current source also being coupled to said first power supply conductor, said eleventh transistor having its collector electrode coupled to said first power supply conductor and its emitter electrode coupled to said base electrode of said twelfth transistor, said twelfth transistor having its collector electrode coupled to said first power supply conductor and its emitter electrode coupled to said base electrode of said tenth transistor, said tenth transistor having its emitter electrode coupled to said emitter electrode of said thirteenth transistor, said thirteenth transistor having its collector electrode coupled to said second power supply conductor, a first resistor being coupled between said emitter of said thirteenth transistor and said emitter of said twelfth transistor, said emitter of said thirteenth transistor being coupled to said output terminal, said feedback compensation capacitor being coupled between said base of said thirteenth transistor and said base of said sixth transistor.

* * * * *